United States Patent [19]

Neugebauer et al.

[11] Patent Number: 4,750,666
[45] Date of Patent: Jun. 14, 1988

[54] METHOD OF FABRICATING GOLD BUMPS ON IC'S AND POWER CHIPS

[75] Inventors: Constantine A. Neugebauer, Schenectady; James A. Loughran, Scotia, both of N.Y.

[73] Assignee: General Electric Company, Schenectady, N.Y.

[21] Appl. No.: 853,255

[22] Filed: Apr. 17, 1986

[51] Int. Cl.⁴ .............................................. B23K 31/02
[52] U.S. Cl. .................................... 228/160; 228/170; 228/4.5
[58] Field of Search .................... 228/160, 4.5, 180.2, 228/226, 245, 254, 5.1, 170; 29/589

[56] References Cited

U.S. PATENT DOCUMENTS 4,099,663 4/1978 Brill et al. .............................. 228/4.5
4,176,443 12/1979 Iannuzzi et al. ................... 228/180.5
4,230,925 10/1980 Lascelles .............................. 228/4.5

FOREIGN PATENT DOCUMENTS 57-4130 1/1982 Japan ..................................... 29/589
244032 12/1985 Japan ..................................... 228/4.5

OTHER PUBLICATIONS

T. S. Liu et al., "A Review of Wafer Bumping for Tape Automated Bonding", Solid State Technology, vol. 23, No. 3, 71-76 (3/80).
R. G. Oswald et al., "Automated Tape Carrier Bonding for Hybrids", Solid State Technology, vol. 21, No. 3, 39-48 (3/78).
L. F. Miller, "A Survey of Chip Joining Techniques", Proc. 1969, Electronic Components Conference, pp. 60-76.

Primary Examiner—M. Jordan
Attorney, Agent, or Firm—Robert Ochis; James C. Davis, Jr.; Marvin Snyder

[57] ABSTRACT

A method for depositing gold bumps on metallized pads of semiconductor chips uses a commercially available thermocompression or thermosonic gold wire bonder. The method includes the steps of depositing a gold ball with an attached wire on the metallized pad, and removing the wire so that a gold bump remains on the pad.

17 Claims, 1 Drawing Sheet

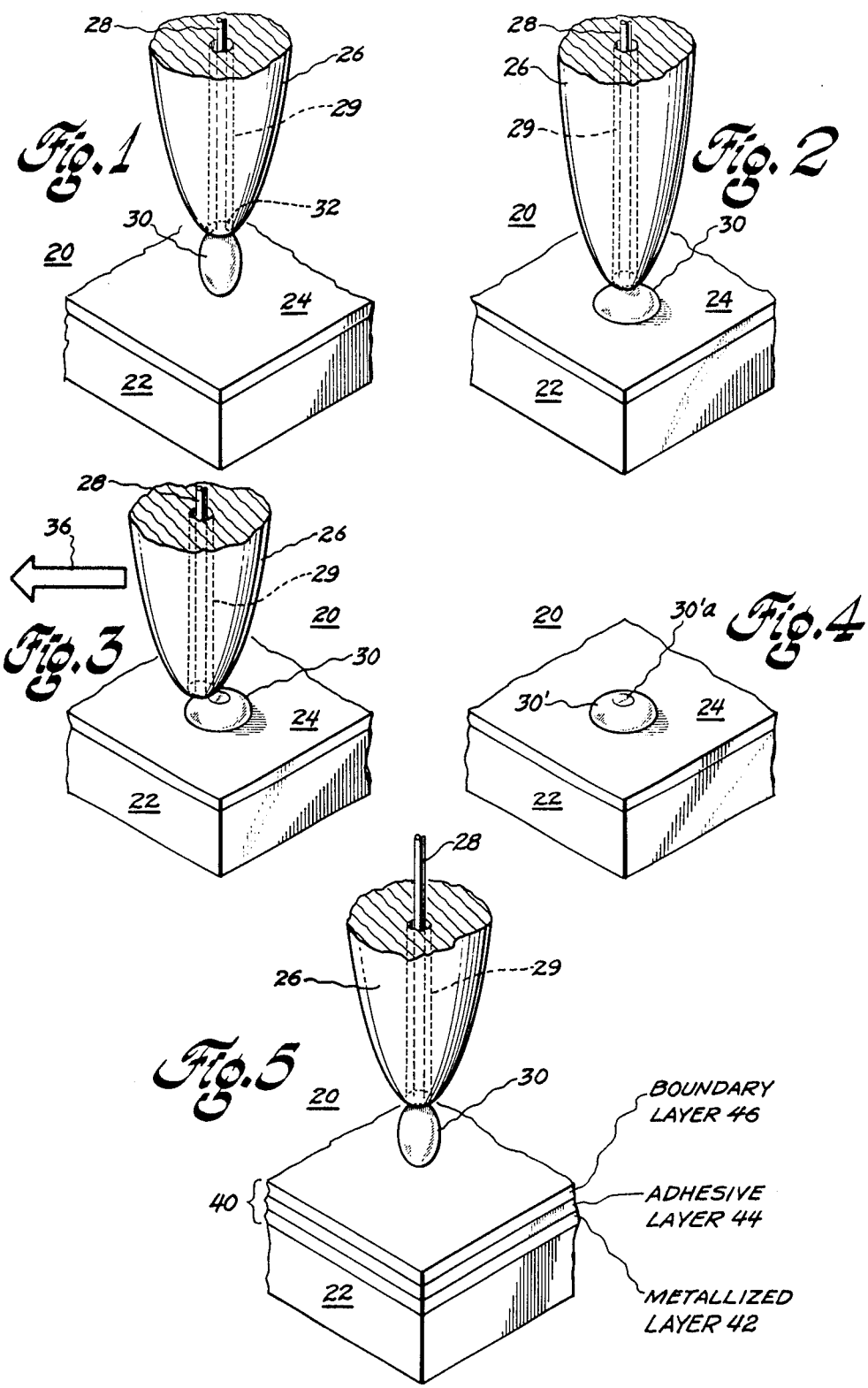

METHOD OF FABRICATING GOLD BUMPS ON IC'S AND POWER CHIPS

This invention relates in general to packaging of semiconductor chips, and more specifically to a method of fabricating gold bumps on metallized semiconductor chip pads.

BACKGROUND OF THE INVENTION

In typical processes of mass producing semiconductor chips for subsequent Tape Automated Bonding (TAB) or flip-chip (face-down) assembly, bare chip pads are prepared for connection to a substrate by a complex photolithographic plating process performed on an entire semiconductor wafer. Such a typical plating process is described in detail in an article by T. S. Liu, W. R. Rodrigues de Miranda and P. R. Zipperlin, "A Review of Wafer Bumping for Tape Automated Bonding", Solid State Technology, Vol. 23, No. 3, 71–76 (March 1980), the entirety of which is incorporated herein by reference. This process involves many complex steps of plating and etching, and results in the formation of gold bumps on the metallized semiconductor chip pads. By this process, a gold bump is formed on each of the pads of each chip which is to be bonded to external circuitry either through an automatic tape bonding or flip-chip assembly process. The process is controlled to produce gold bumps of uniform thickness. In a typical TAB process, metal leads are subsequently bonded to the gold bumps for connecting the semiconductor chip to a substrate, for example through the use of a tape automated bonding (TAB) system. Such a TAB process is shown in an article by R. G. Oswald, J. M. Montante, and W. R. Rodrigues de Miranda, "Automated Tape Carrier Bonding for Hybrids", Solid State Technology, Vol. 21, No. 3, 39–48, (March 1978), the entirety of which is incorporated herein by reference. Alternatively, the plated or "bumped" chips can be used in a highly efficient and economical face-down bonding process wherein the chips are inverted and direct bonded to connection areas of a package. A typical face-down process is shown in an article by L. F. Miller, "A Survey of Chip Joining Techniques", Proc. 1969 Electronic Components Conference, pp. 60–76, the entirety of which is incorporated herein by reference.

While the plating process described above is adequate for use on a full wafer, it is prohibitively expensive and difficult to perform on individual or small quantities of chips. Applications requiring the packaging of discrete bare chips, for example the fabrication of densely packed custom circuits, require that each bare chip be wired in by the use of a gold or aluminum wire bonder. Such gold wire bonders typically comprise thermosonic or thermocompression methods, and enable a separate flying lead to be individually run between each metallized pad on the bare chip and its corresponding connection on a substrate. Such a process makes it impossible to take advantage of the less costly and faster processes of TAB or face-down bonding. Further, commercial and proprietary considerations make it difficult to even purchase bare chips or wafers, thereby making it difficult for a customer to perform his own wafer scale plating process even if he has available such a capability.

It would thus be desirable to provide a method of fabricating gold bumps on the metallized pads of small quantities of individual semiconductor chips which is economical to practice with commercially available equipment. Such a process would subsequently permit the chip to be mounted to a substrate using the economical and commercially available TAB or face-down bonding processes.

OBJECTS OF THE INVENTION

A principal object of the present invention is to provide a new and improved method of fabricating a gold bump on a metallized pad of a semiconductor chip.

Another object of the present invention is to provide a method of using a gold wire bonder to fabricate a gold bump on a semiconductor chip pad, this method being economically and technically feasible to perform on single or small quantities of chips.

A further object of the present invention is to provide a method of using a gold wire bonder to fabricate a gold bump on a semiconductor chip pad which can be performed using commercially available equipment.

Another object of the present invention is to provide a method of using a gold wire bonder to fabricate a gold bump on a semiconductor chip pad such that the semiconductor chip can be subsequently bonded to a substrate using a tape automated bonding system.

Yet another object of the present invention is to provide a method of using a gold wire bonder to fabricate a gold bump on a semiconductor chip pad such that the semiconductor chip can be subsequently bonded to a substrate using a face-down bonding process.

SUMMARY OF THE INVENTION

A new and improved method of using a gold wire bonder for fabricating a gold bump on a metallized pad of a semiconductor chip is provided which can be performed economically on small quantities of bare chips with commercially available equipment. The method is performed on a semiconductor chip including at least one metallized pad. A gold wire bonder, preferably a commercially available thermosonic or thermocompression gold wire bonder, is used to deposit a gold ball with an attached wire to the metallized pad. The wire is subsequently removed from the gold ball, leaving a gold bump bonded to the pad.

BRIEF DESCRIPTION OF THE DRAWINGS

While the specification concludes with claims defining the features of the invention that are regarded as novel, it is believed that the invention, together with further objects thereof, will be better understood from a consideration of the following description in conjunction with the drawing Figures, in which:

FIGS. 1 through 4 show perspective views of a portion of a semiconductor device undergoing subsequent steps in the fabrication of a gold bump on a metallized pad in accordance with the present invention; and FIG. 5 shows a perspective view of a portion of a semiconductor device constructed in accordance with an alternate embodiment of the invention.

DETAILED DESCRIPTION OF THE INVENTION

Referring now to FIG. 1, a portion 20 of an integrated circuit (not shown in its entirety) includes a layer of semiconductor material 22 supporting a metallized pad 24. Wafer 22 comprises for example silicon or gallium arsenide, while metallized pad 24 comprises for example aluminum (Al), gold (Au) or platinum (Pt).

Further shown is a conically-shaped capillary tube 26 of a gold wire bonder (not shown), the bonder preferably comprising a commercially available thermosonic or thermocompression gold wire bonder. As is readily known to those skilled in the art, thermocompression gold wire bonders operate to bond gold to a metal such as aluminum in the presence of heat and pressure, while thermosonic gold wire bonders perform a similar function in a relatively lower temperature environment using pressure and ultrasonic agitation. Such bonders are typified by the commercially available Model 420 manual thermocompression bonder and the Model 1419-3 auto-thermosonic bonder, both available from the Kulicke and Soffa Company.

Both ultrasonic bonds and thermocompression bonds have been used for joining devices in flip-chip style. With these techniques, the bumps can be either on the chips or on the substrate. In accordance with the present invention, the bumps are fabricated on the chip. For ultrasonic bonds in particular, both the lands and device pads must be reasonably planar, or the ultrasonic scrubbing action will pivot the chip. Thermocompression bonding tends to be a little more lenient in this respect, since the pads are crushed down and overcome some lack of planarity. The thermocompression bond requires a relatively high temperature of processing; the pure ultrasonic bond requires no high temperature at all. The thermosonic bond employs an elevated temperature which is significantly lower than that used in thermocompression bonding.

A gold wire feed 28 is shown extending through a bore 29 in capillary tube 26 and terminating in a gold ball 30 at a tube outlet 32. As is readily known to those skilled in the art, gold ball 30 is formed by "electronic flame-off", a term used in the art to refer to a process whereby gold wire 28 is exposed from outlet 32 of capillary tube 26 and a spark generator electrode (not shown) is used to melt the exposed gold wire to form ball 30.

FIG. 2 shows capillary tube 26 being positioned, in a manner readily understood by those skilled in the art, such that gold ball 30 is contacting metallized pad 24. In the normal operation of a gold wire bonder, a flying lead comprising gold wire 28 would be run to a package connection (not shown), and the gold wire bonder used to wedge-bond the free end of the flying lead to the package connection.

In accordance with a feature of the invention, FIG. 3 shows wire 28 in the process of being broken from gold ball 30. This breaking of the connection between wire 28 and gold ball 30 is preferably performed by shearing. Such shearing is accomplished by halting the motion of wire 28 through capillary tube 26 and moving the capillary tube in a direction generally parallel to metallized pad 24 (e.g., in the direction indicated by arrow 32). Alternatively, wire 28 can be broken from gold ball 30 by, for example, pulling or melting.

FIG. 4 shows wire 28 broken, thereby leaving a gold bump 30' deposited on metallized pad 24. (For the purpose of clarity, once gold ball 30 is deposited on metallized pad 24 with its attendant change in shape, it is subsequently referred to as gold bump 30'). The resulting gold bump 30' has a generally flat top 30a' formed by the shearing of wire 28 from gold ball 30. This bump deposition process is repeated for each pad on the chip. The resulting bumped chip is readily compatible with follow-on TAB or face-down bonding processes of the type described hereinabove.

While the invention has so far been described as depositing a gold bump directly on a single layer metallized pad 24, it is not so limited. The invention can also be practiced on metallized pads comprising multiple layers of the type described in the references cited hereinabove, particularly in the article by T. S. Liu et al. Such multiple layer are optionally employed as required to form gold bumps of specific types of characteristics. For example, a metallized pad 40 is shown in FIG. 5 which comprises three layers 42, 44, and 46, the purpose of the three layers being the formation of a gold bump more strongly bonded to semiconductor material 22 than those formed by the process described hereinabove.

In FIG. 5, layer 42 comprises a metallized pad deposited directly on semiconductor portion 22, consisting for example of aluminum. Layer 44, disposed on layer 42, is an adhesive layer comprising a metal characterized by an affinity for bonding to layer 42, for example chromium (Cr). Such an adhesive layer functions, in a manner known to those skilled in the art, to prevent intermetallic compounds from forming between metal layer 42 and gold bump 30'. Layer 46, disposed on layer 44, is a boundary layer comprising a metal characterized by an affinity for bonding to both the metal of layer 44 and gold ball 30, for example gold. The resulting three layer pad 40 comprises a very strong bond between semiconductor layer 22 and gold ball 30. It will be appreciated that the types and quantities of the various metal layers are selected to produce the desired characteristics of the bond between the gold bump and the semiconductor layer, and that the use of multiple layers may have the drawback of increasing the expense and complexity of the method of the subject invention.

There is thus provided a method for depositing gold bumps on metallized pads of semiconductor chips. This method is readily implemented using relatively inexpensive commercially available equipment, and produces a gold gall compatible with follow-on face-down or TAB bonding processes.

While preferred embodiments of the invention have been illustrated and described, it will be clear that the invention is not so limited. Numerous modifications, changes, variations, substitutions and equivalents will occur to those skilled in the art without departing from the spirit and scope of the present invention. Accordingly, it is intended that the invention herein be limited only by the scope of the appended claims.

What is claimed is:

1. A method for using a gold wire bonder for fabricating a gold bump on a semiconductor chip pad, comprising:
 (a) providing said semiconductor chip including at least one metallized pad thereon;
 (b) bonding a gold ball with an attached wire to said metallized pad using a gold wire bonder; and
 (c) severing said wire from said gold ball at there juncture so that a gold bump remains bonded to said metallized pad, said gold bump having a configuration suitable for bonding said pad to an external contact.

2. A method in accordance with claim 1 wherein said gold wire bonder comprises a thermosonic or thermocompression gold wire bonder.

3. A method in accordance with claim 2 wherein said step of removing said wire from said gold ball is performed by shearing said wire from said gold ball.

4. A method in accordance with claim 2 wherein said semiconductor chip comprises a signal level integrated circuit.

5. A method in accordance with claim 2 wherein:
said semiconductor chip comprises a power semiconductor device; and
said metallized pad comprises a current conducting pad on said power semiconductor device.

6. A method in accordance with claim 2 wherein said metallized pad comprises aluminum (Al) or gold (Au) or platinum (Pt).

7. A method in accordance with claim 6 and further including an adhesive layer between said metallized pad and said gold bump comprising a metal which bonds well to said metallized pad.

8. A method in accordance with claim 7 and further including a boundary layer between said adhesive layer on said gold bump comprising a metal which bonds well to both said adhesive layer and said gold bump.

9. A method of using a gold wire bonder for fabricating a gold ball on a semiconductor chip pad, said bonder having a capillary tube for delivering a gold wire to said pad comprising the steps of:
providing said semiconductor chip including at least one metallized pad;
forming a gold ball at one end of said gold wire and depositing said ball on said pad; and
moving said capillary tube in a direction generally parallel to the plane occupied by said pad to shear said wire from said ball at their juncture in the area of said ball most distant from said pad.

10. The method recited in claim 9 wherein said step of severing forms a generally flat surface in said area.

11. The method recited in claim 1 further comprising repeating steps (b) and (c) for each of said at least one metallized pad to provide a set of gold bumps having the portion of their surfaces remote from said pads in substantially a common plane.

12. A method of preparing a semiconductor chip having a plurality of metallized pads thereon for mounting, said method comprising:
(a) bonding a gold ball with an attached wire to one of said metallized pads using a gold wire bonder; and
(b) severing said wire froms aid gold gall at their juncture so that a gold bump remains bonded to said metallized pad, said gold bump having a configuration suitable for bonding said pad to an external contact; and
(c) repeating steps (a) and (b) for each of said metallized pads.

13. The method recited in claim 12 wherein said removing step comprises shearing said wire from said ball at the juncture between said wire and said ball to provide a gold bump which is free of any protruding portion of said wire.

14. A method of mounting a semiconductor chip having a plurality of metallized pads thereon comprising:
(a) bonding a gold ball with an attached wire to one of said metallized pads using a gold wire bonder;
(b) severing said wire from said gold ball at their juncture so that a gold bump remains bonded to said metallized pad, said gold bump having a configuration suitable for bonding said pad to an external contact;
(c) repeating steps (a) and (b) for each of said pads in a manner to provide gold bumps, the portions of whose surfaces most remote from said pads are substantially in a common plane; and
(d) bonding each of said gold bumps to a correspondingly lead on a tape for use in a tape automated bonding system.

15. The method recited in claim 14 wherein said removing step comprises shearing said wire from said ball at the juncture between said wire and said ball to provide a gold bump which is free of any protruding portion of said wire.

16. A method of mounting on a substrate a semiconductor chip having a plurality of metallized pads thereon comprising:
(a) bonding a gold ball with an attached wire to one of said metallized pads using a gold wire bonder;
(b) severing said wire from said gold ball at their juncture so that gold bump remains bonded to said metallized pad, said gold bump having a configuration suitable for bonding said pad to an external contact;
(c) repeating steps (a) and (b) for each of said metallized pads, in a manner to provide gold bumps, the portions of whose surfaces most remote from said pads are substantially in a common plane;
(d) thereafter placing said chip in a bump toward said substrate position with said bumps in alignment with pads on said substrate; and
(e) bonding said bumps to said pads on said substrate.

17. The method recited in claim 16 wherein said removing step comprises shearing said wire from said ball at the juncture between said wire and said ball to provide a gold bump which is free of any protruding portion of said wire.

* * * * *